(12) United States Patent
Hasegawa et al.

(10) Patent No.: US 12,198,748 B2
(45) Date of Patent: Jan. 14, 2025

(54) SEMICONDUCTOR MEMORY DEVICES AND CONTROLLER INCLUDING ADJUSTABLE STROBE DELAY

(71) Applicant: UltraMemory Inc., Tokyo (JP)

(72) Inventors: Masatoshi Hasegawa, Tokyo (JP); Akihiko Takizawa, Tokyo (JP); Shigeru Nakahara, Tokyo (JP); Yuji Motoyama, Tokyo (JP); Hideyuki Yoko, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

(21) Appl. No.: 18/019,349

(22) PCT Filed: Jul. 5, 2022

(86) PCT No.: PCT/JP2022/026682
§ 371 (c)(1),
(2) Date: Feb. 2, 2023

(87) PCT Pub. No.: WO2024/009384
PCT Pub. Date: Jan. 11, 2024

(65) Prior Publication Data
US 2024/0257861 A1 Aug. 1, 2024

(51) Int. Cl.
*G11C 11/4076* (2006.01)
*G11C 11/4093* (2006.01)

(52) U.S. Cl.
CPC ...... *G11C 11/4076* (2013.01); *G11C 11/4093* (2013.01)

(58) Field of Classification Search
None
See application file for complete search history.

(56) References Cited

U.S. PATENT DOCUMENTS 6,789,209 B1 * 9/2004 Suzuki ............... G11C 7/222
713/401
9,111,599 B1 * 8/2015 Bringivijayaraghavan ..............
G11C 29/028
(Continued)

FOREIGN PATENT DOCUMENTS

| JP | 2011081731 A | 4/2011 |
| JP | 2011528837 A | 11/2011 |

(Continued)

*Primary Examiner* — J. H. Hur
(74) *Attorney, Agent, or Firm* — Muncy, Geissler, Olds & Lowe, P.C.

(57) ABSTRACT

A semiconductor device according to an embodiment of the present invention which can rapidly output data while being relatively low cost includes: a plurality of memory each including: a strobe signal transmission path having, in this order, a strobe input terminal, a strobe delay circuit, and a strobe output terminal; a plurality of data output circuits connected to a downstream side of the strobe delay circuit of the strobe signal transmission path; and a data output bus connected to the plurality of data output circuits; and a controller including: a strobe circuit which inputs the strobe signal to the strobe input terminal; a data buffer circuit which temporarily stores the data outputted from the data output terminal; and a delay adjustment circuit which adjusts a delay amount of the strobe delay circuit so as to decrease a difference between the memory in delay of the strobe signal outputted from the strobe output terminal relative to the strobe signal outputted from the strobe circuit.

7 Claims, 6 Drawing Sheets

(56) References Cited

U.S. PATENT DOCUMENTS

| | | | |
|---|---|---|---|
| 2007/0109908 A1* | 5/2007 | Best | G11C 7/222 |
| | | | 365/233.14 |
| 2010/0014364 A1* | 1/2010 | Laberge | G11C 7/1006 |
| | | | 365/189.011 |
| 2011/0093735 A1 | 4/2011 | Yoko et al. | |
| 2013/0294176 A1 | 11/2013 | Nishio | |
| 2014/0286112 A1 | 9/2014 | Ide et al. | |
| 2015/0286405 A1* | 10/2015 | Chang | G11C 16/00 |
| | | | 711/103 |
| 2023/0326514 A1* | 10/2023 | Ayyapureddi | G11C 7/1093 |

FOREIGN PATENT DOCUMENTS

| | | |
|---|---|---|
| JP | 2013232152 A | 11/2013 |
| JP | 2014186598 A | 10/2014 |
| WO | WO-2010/011503 A2 | 1/2010 |

\* cited by examiner

SEMICONDUCTOR MEMORY DEVICES AND CONTROLLER INCLUDING ADJUSTABLE STROBE DELAY

TECHNICAL FIELD

The present invention relates to a semiconductor device.

BACKGROUND ART

Volatile memory (RAM) such as DRAM (Dynamic Random Access Memory) has been conventionally known as a storage device. Increased capacity which can withstand the increased performance and increase in data volume of arithmetic units (hereinafter referred to as logical chip or logic chip) has been demanded in DRAM. Therefore, increased capacity by refinement of memory (memory cell array, memory) and planar expansion of cells has been attempted. On the other hand, this type of increased capacity is reaching its limit due to susceptibility to noise by refinement, increase in chip area, etc.

Therefore, nowadays, technology is being developed to realize increased capacity by laminating a plurality of planar memory to three-dimensionalize. In addition, accompanying an increase in data volume, a speed increase in data communication with chips (logic chip and memory) has been attempted (for example, refer to Patent Documents 1 and 2).

Patent Document 1: Japanese Unexamined Patent Application (Translation of PCT Application), Publication No. 2011-528837

Patent Document 2: Japanese Unexamined Patent Application, Publication No. 2011-081731

DISCLOSURE OF THE INVENTION

Problems to be Solved by the Invention

Patent Document 1 discloses adjusting the timing of a read-out strobe signal in laminated memory device dies, so that read data from all memory device dies (memory) or another signal are received at the same time. With such a configuration, a number of circuits for correcting the timing as the number of memories is necessary, and thus a problem can arise in a size increase in the semiconductor device, and a cost increase. In addition, in the case of providing a plurality of data output circuits, handling becomes more difficult. Furthermore, Patent Document 1 is not providing a method for matching the data reception times between memory, and thus operation is difficult.

In addition, Patent Document 2 discloses providing to each of a plurality of core chips (memory), a data output circuit which outputs read data to an interface chip in response to a read command (strobe signal), and an output timing adjustment circuit which makes the time from when accepting the read command until the read data is outputted by the data output circuit match between the plurality of core chips. When providing a complicated output timing adjustment circuit to each memory, there is concern over the memory increasing in size, and the cost drastically rising. In addition, Patent Document 2 also does not provide a method of calibration for matching the output timings between memory.

The present invention has been made taking account of the above such problems, and has an object of providing a semiconductor device which can rapidly output data while being relatively low cost.

Means for Solving the Problems

A semiconductor device according to an aspect of the present invention includes: a plurality of memory each including: a strobe signal transmission path having, in this order, a strobe input terminal to which a strobe signal is inputted, a strobe delay circuit which delays the strobe signal, and a strobe output terminal which outputs the strobe signal, the strobe signal transmission path sending the strobe signal; a plurality of data output circuits connected to a downstream side of the strobe delay circuit of the strobe signal transmission path, storing respective data, and outputting the data when the strobe signal is inputted; and a data output bus connected to the plurality of data output circuits and having a data output terminal which externally outputs the data; and a controller including: a strobe circuit which outputs the strobe signal to the strobe input terminal; a data buffer circuit which receives the data outputted from the data output terminal, temporarily stores the data received, and outputs the data according to the strobe signal outputted from the strobe output terminal; and a delay adjustment circuit which adjusts a delay amount of the strobe delay circuit so as to decrease a difference between the memory in delay of the strobe signal outputted from the strobe output terminal relative to the strobe signal outputted from the strobe circuit.

In the aforementioned semiconductor device, the controller may further include a control delay circuit which delays the strobe signal outputted from the strobe circuit, and the delay adjustment circuit may adjust a delay amount of the strobe delay circuit based on a phase difference between the strobe signal outputted from the control delay circuit and the strobe signal outputted from the strobe output terminal.

In the aforementioned semiconductor device, the delay adjustment circuit may adjust a delay amount of the strobe delay circuit, based on a phase difference between the strobe signals outputted from the strobe output terminals of two of the memory in response to one of the strobe signal outputted from the strobe circuit.

The delay adjustment circuit may measure a time from when the strobe circuit outputs the strobe signal until the strobe signal is outputted from the strobe output terminal.

In the aforementioned semiconductor device, the memory may further include a feedback circuit connected between the strobe input terminal and the strobe output terminal, and forming an oscillation circuit together with the strobe signal transmission path, and the delay adjustment circuit may adjust a delay amount of the strobe delay circuit based on a cycle of a signal outputted from the strobe output terminal.

In the aforementioned semiconductor device, the delay adjustment circuit may adjust a delay amount of the strobe delay circuit in a case of an operating condition of the semiconductor device having changed.

Effects of the Invention

According to the present invention, it is possible to provide a semiconductor device which can rapidly output data while being relatively low cost.

PREFERRED MODE FOR CARRYING OUT THE INVENTION

Figure 1:
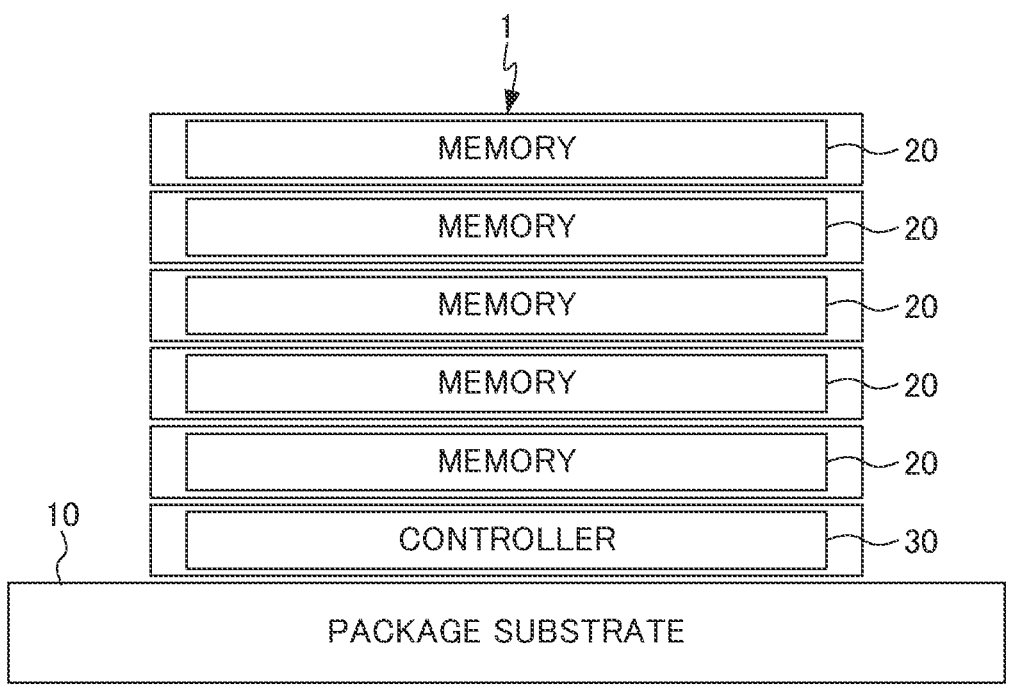
FIG. 1 is a schematic diagram showing the configuration of a semiconductor device according to a first embodiment of the present invention.
Figure 2:
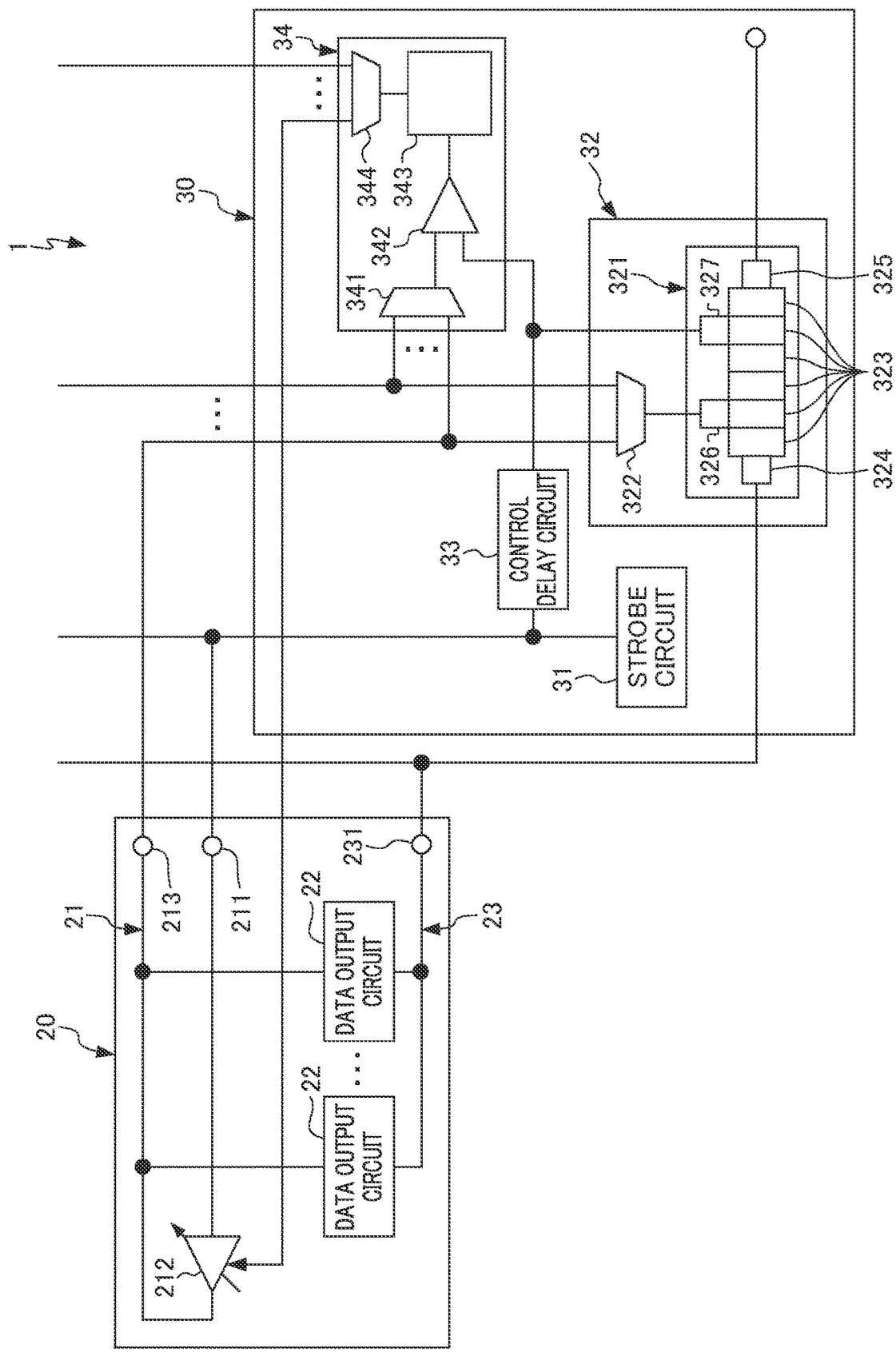
FIG. 2 is a simplified circuit diagram showing a main circuit configuration of the semiconductor device of FIG. 1.

Hereinafter, embodiments of the present invention will be explained while referencing the drawings. FIG. 1 is a schematic diagram showing the configuration of a semiconductor device 1 according to a first embodiment of the present invention. FIG. 2 is a simplified circuit diagram showing a circuit configuration of the semiconductor device 1.

The semiconductor device 1 according to the first embodiment of the present invention includes: a package substrate 10, a plurality of memory 20 configured one on each chip, and a single controller 30 configured on one chip. In the semiconductor device 1, the controller 30 is mounted on the package substrate 10, and a plurality of chips in which the memory 20 are respectively configured are mounted to overlap on the chip in which this controller 30 is configured.

The package substrate 10 supplies an electrical circuit for connection between the electric supply and outside. The package substrate 10 can be designed based on well-known technology.

The memory 20 each include: a strobe signal transmission path 21 which transmits a strobe signal inputted from the controller 30; a plurality of data output circuits 22 connected to the strobe signal transmission path 21, respectively storing data, and outputting data when the strobe signal is inputted from the strobe signal transmission path 21; and a common data output bus 23 which is connected to the plurality of data output circuits 22, and for externally outputting data outputted from each data output circuit 22. It should be noted that a plurality of corresponding memory banks (not shown) can be connected to a respective data output circuit 22. The data output circuit 22 can be configured so as to output data read from the memory bank connected to each.

The strobe signal transmission path 21 has, in this order, a strobe input terminal 211 at which the strobe signal is inputted; a strobe delay circuit 212 which delays the strobe signal, and a strobe output terminal 213 which externally outputs the strobe signal (feedback signal). The strobe delay circuit 212 is established as a variable delay circuit capable of adjusting the delay amount from outside. As an example, the strobe delay circuit 212 can be configured so as to have a 6-bit register and be able to adjust the delay amount in 64 stages according to a value set in this register.

The data output circuit 22 is connected on the downstream side of the strobe delay circuit of the strobe signal transmission path 21 at an upstream-side end, and is connected to the data output bus 23 at the downstream-side end. The data output circuit 22 stores the respective data, and outputs the data stored in the data output bus 23 when the strobe signal is inputted from the strobe signal transmission path 21. Such a data output circuit 22 can be established as a known configuration. It should be noted that each data output circuit 22 has data width, and has many output wires for outputting multi-bit data.

The data output bus 23 has a data output terminal 231 which externally outputs data outputted from the data output circuit 22. The data output bus 23 has a plurality of wires corresponding to the data width of the data output circuit 22. The strobe signal transmission path 21, plurality of data output circuits 22 and data output bus 23 are arranged so that the path length from the strobe input terminal 211 until the data output terminal 231 becomes constant irrespective of the data output circuit 22 passed through. Typically, the strobe signal transmission path 21 extends from the strobe input terminal 211 to one side in a predetermined direction, turns back midway, the portion after turning back extends to the other side in the predetermined direction, and reaches the strobe output terminal 213. The plurality of data output circuits 22 are connected to a portion of the strobe signal transmission path 21 extending to the other side in the predetermined direction on the downstream side of the strobe delay circuit 212, and the data output bus 23 extends to the other side in the predetermined direction parallel to the terminal portion of the strobe signal transmission path 21, at least in a portion at which the data output circuit 22 is connected.

According to such a configuration, the memory 20 is slightly delayed after the strobe signal is inputted to the strobe input terminal 211, outputs the delayed strobe signal from the strobe output terminal 213, and outputs data from the data output terminal 231 roughly simultaneously.

The controller 30 includes: a strobe circuit 31 which inputs the strobe signal to the strobe input terminal 211; a data buffer circuit 32 which receives data outputted from the data output terminal 231, temporarily stores the received data, and outputs data in the same cycle as the strobe signal; a control delay circuit 33 which delays the strobe signal outputted from the strobe circuit 31; and a delay adjustment circuit 34 which adjusts the delay amount of the strobe delay circuit 212 so as to reduce the difference between memory 20 of delay of the strobe signal outputted from the strobe output terminal 213 relative to the strobe signal outputted from the strobe circuit 31.

The strobe circuit 31 is a known circuit which outputs a cyclical square wave-like signal defining the timing of transmission of data between the memory 20 and controller 30.

The data buffer circuit 32 can be established as a configuration including: a FIFO circuit 321 which temporarily stores data received from the memory 20 and outputs in a first-in first-out manner in response to the strobe signal outputted from the control delay circuit 33; and a data selector 322 which selects the strobe signal defining the timing of receiving data.

The FIFO circuit 321 includes: a plurality of banks 323 which respectively store a set of data; a buffer input unit 324 to which data is inputted from the memory 20; a buffer output unit 325 for outputting data outside of the controller 30; an input pointer 326 to which a signal defining the timing of storing data is inputted; and an output pointer 327 to which a signal defining the timing of outputting data is inputted.

The FIFO circuit 321 is a known circuit which stores the data inputted to the buffer input unit 324 to the bank 323 when a signal is inputted to the input pointer 326, and outputs the oldest data among that stored when a signal is inputted to the output pointer 327, and deletes from the bank 323. It is configured so that only data outputted from the memory 20 selected by the selection circuit (not shown) is inputted to the buffer input unit 324. In the present embodiment, the delay from output of the strobe signal from the strobe circuit 31 until data input to the buffer input unit 324 is adjusted basically by the control delay circuit 33; therefore, the FIFO circuit 321 has a number of banks 323 which can absorb the variation in delay time from output of the strobe signal from the strobe circuit 31 until input of data to the buffer input unit 324. Therefore, the FIFO circuit 321 is designed so as to establish the relationship (number of banks 323)>(((maximum delay time of data input)−(minimum delay time of data input))/(cycle of strobe signal)).

The data selector 322 inputs any of the strobe signals outputted from the respective strobe output terminals 213 of the memory 20 to the input pointer 326. The data selector 322 inputs the strobe signal outputted from the memory 20 outputting the data inputted to the buffer input unit 324 to the input pointer 326, in accordance with a command signal from a selection circuit (not shown) selecting the memory 20 to read out data.

After the strobe circuit 31 sends the strobe signal, the control delay circuit 33 delays the strobe signal by a time set in advance as the time for which the data outputted from the memory 20 by this strobe signal is stored in the FIFO circuit 321, and inputs to the output pointer 327.

The delay adjustment circuit 34 is configured so as to adjust the delay amount of the strobe delay circuit 212 based on the phase difference between the signal inputted to the input pointer 326 of the FIFO circuit 321 and the signal inputted to the output pointer 327, i.e. phase difference between the strobe signal inputted from the control delay circuit 33 and the strobe signal outputted from the strobe output terminal 213 of the memory 20. More specifically, the delay adjustment circuit 34 can be established as a configuration having an input selector 341, phase difference detector 342, delay amount arithmetic unit 343, and output selector 344.

Such a delay adjustment circuit 34 corrects the value of the register setting the delay amount of the strobe delay circuit 212 so as to keep the phase difference between the strobe signal outputted from the control delay circuit 33 and the strobe signal outputted from the strobe output terminal 213 to no more than a value set in advance. In this way, by configuring so as to keep constant the phase difference between the strobe signal outputted from the control delay circuit 33 and the strobe signal outputted from the strobe output terminal 213 of each memory 20, it is possible to relatively easily and reliably make the delay times of the memory 20 substantially equal. Upon performing adjustment by the delay adjustment circuit 34 so as to be able to confirm the difference in delay times reliably according to the phase difference, it may be configured so as to output the strobe signal of a long cycle to the strobe circuit 31.

The delay adjustment circuit 34 may be configured so as to normally adjust the delay amount of the strobe delay circuit 212; however, it can be configured so as to adjust the delay amount of the strobe delay circuit 212 in the case of the operation condition of the semiconductor device 1 having changed. More specifically, when the voltage changes by a fixed value since power up of the semiconductor device 1, reset, or a previous adjustment, it can be configured so as to adjust the delay amount of the strobe delay circuit 212 only in the case of satisfying a predetermined condition such as the temperature of the semiconductor device 1 having changed by at least a fixed value. Since it is thereby unnecessary to give margin for adjustment of the delay amount of the strobe delay circuit 212 in a cycle of the strobe signal, it is possible to improve the read speed of data from the memory 20. In addition, the delay adjustment circuit 34 may be configured so as to adjust in series the delay amount of the strobe delay circuit 212 of each memory 20, or may be configured so as adjust the delay amount of memory 20 when this memory 20 has been selected, or to perform a necessity judgment for adjustment.

In the above way, the semiconductor device 1 can make the delay time of data output of each memory 20 substantially equal, due to including the delay adjustment circuit 34. For this reason, it is possible to decrease the number of banks 323 of the data buffer circuit 32. If the width (bit number) of data outputted from the memory 20 becomes large, the number of banks 323 can greatly influence the cost and size of the controller 30, and thus the semiconductor device 1. Therefore, the semiconductor device 1 including the delay adjustment circuit 34 can rapidly output data, while being relatively low cost.

Figure 3:
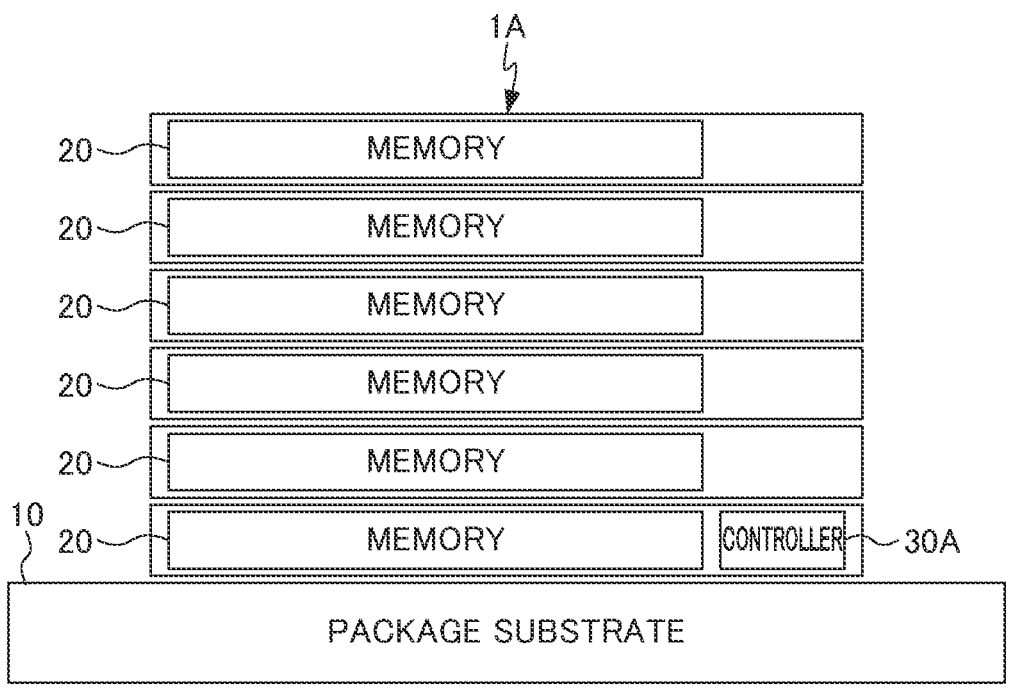
FIG. 3 is a schematic diagram showing the configuration of a semiconductor device according to a second embodiment of the present invention.
Figure 4:
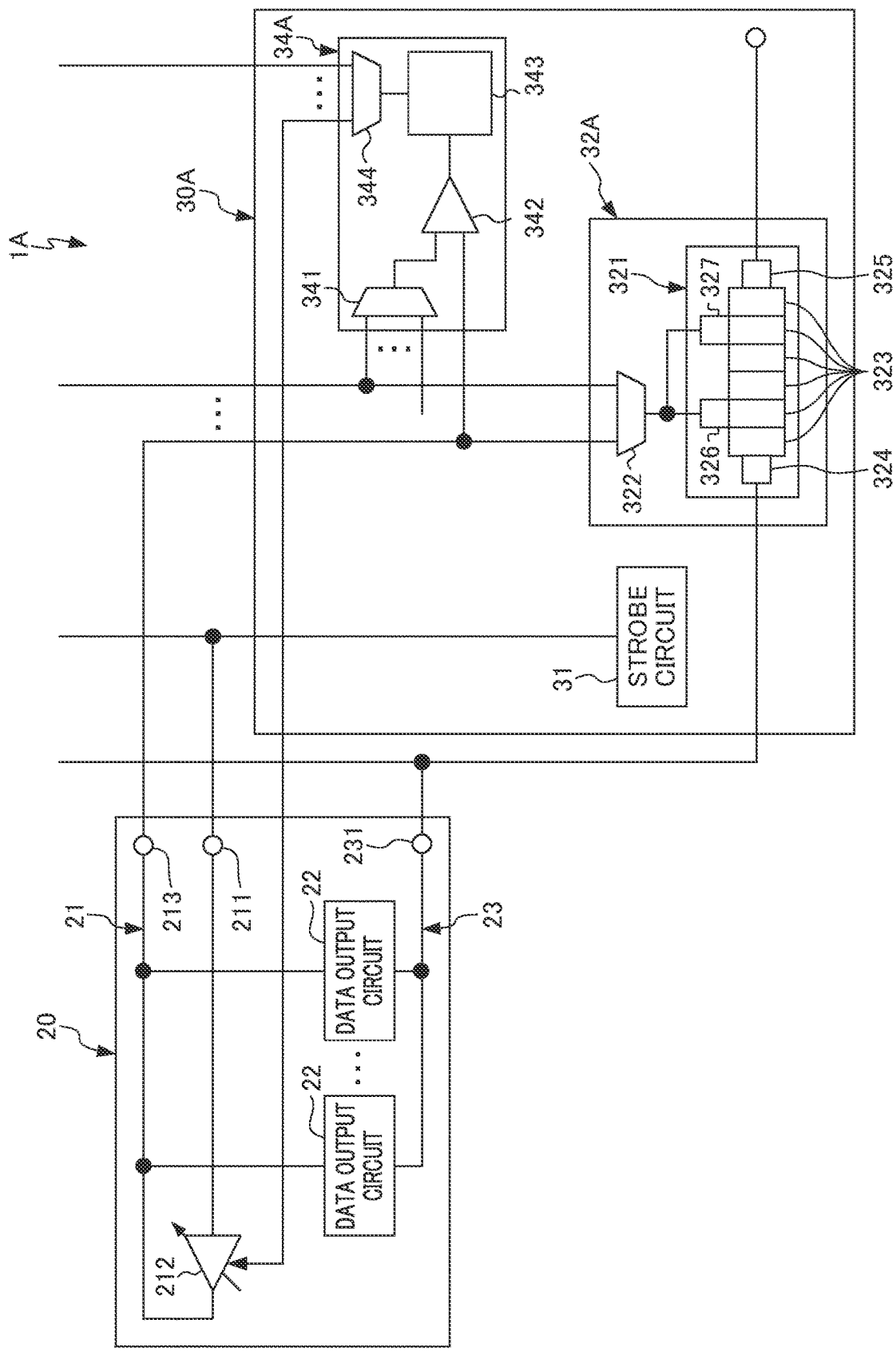
FIG. 4 is a simplified circuit diagram showing a main circuit configuration of the semiconductor device of FIG. 3.

Next, a different embodiment of the present invention will be explained. It should be noted that, in the explanation of the following embodiments, the same reference numbers are attached to constituent elements similar to the embodiment previously explained, and redundant explanations may be omitted. FIG. 3 is a schematic diagram showing the configuration of a semiconductor device 1A according to a second embodiment of the present invention. FIG. 4 is a simplified circuit diagram showing the circuit configuration of the semiconductor device 1A.

The semiconductor device 1A according to the second embodiment of the present invention includes a package substrate 10, a plurality of memory 20 and a single controller 30A. In the semiconductor device 1A, one memory 20 and the controller 30A are configured on the same chip. Since the controller 30A is relatively space saving, the chip on which the memory 20 and controller 30A are configured can be formed so as to be substantially the same size as a chip on which only the memory 20 is configured. For this reason, the semiconductor device 1A of FIG. 3 increases the number of layers of memory without increasing the footprint relative to the semiconductor device 1 of FIG. 1.

The controller 30A includes: a strobe circuit 31 which inputs the strobe signal to the strobe input terminal 211; a data buffer circuit 32A which receives data outputted from the data output terminal 231, temporarily stores the received data, and outputs data synchronously with the strobe signal outputted from the strobe output terminal 213; and a delay adjustment circuit 34A which adjusts the delay amount of the strobe delay circuit 212 so as to reduce the difference between the memory 20 of the delay of the strobe signal outputted from the strobe output terminal 213 relative to the strobe signal outputted from the strobe circuit 31.

The data buffer circuit 32A of the present embodiment is the same as the data buffer circuit 32 of FIG. 2 including the FIFO circuit 321, and the data selector 322 which selects the strobe signal defining the timing of receiving data, but it differs in the point of the strobe signal selected by the data selector 322 being inputted to the input point 326 and output pointer 327. According to this configuration, although the value of the bank 323 not storing data is outputted immediately after startup, by resetting all of the values of the bank 323 to zero initially, a problem does not arise.

The delay adjustment circuit 34A can be configured so as to adjust the delay amount of the strobe delay circuit 212 based on the phase difference between the strobe signal outputted from the strobe output terminal of two memory 20 (memory 20 serving as reference and memory 20 serving as adjustment target) in response to a single strobe signal outputted from the strobe circuit 31. In other words, the delay adjustment circuit 34A can be configured so as to set the memory 20 serving as the reference, and repeat a process of matching the delay time of other memory 20 to the memory 20 serving as the reference one by one by way of the delay adjustment circuit 34. More specifically, the delay adjustment circuit 34A can be established as a configuration including the input selector 341 which selects the strobe signal fed back from the memory 20 serving as the adjustment target; a phase difference detector 342 which detects a feedback signal of the memory 20 serving as the reference and a feedback signal of the memory 20 serving as the adjustment target; a delay amount arithmetic unit 343; and an output selector 344. In this way, by confirming the difference in delay time of the strobe signal transmission path 21 of the two memory 20 by the same strobe signal, it is possible to more accurately reduce the difference in delay time between memory 20.

In the present embodiment, the set value for the delay amount of the strobe delay circuit 212 of the memory 20 serving as the reference is set so as to be able to make the strobe delay circuit 212 of another memory 20 adjustable. For example, in the case of establishing the memory 20 on the same chip as the controller 30A as the reference, it is preferable to set the set value of the strobe delay circuit 212 of the memory 20 serving as the reference to a sufficiently large value, so as to be able to make the set value of the strobe delay circuit 212 of another memory 20 for which the transmission distance is longer to smaller than the set value of the strobe delay circuit 212 of the memory 20 serving as the reference. Conversely, in the case of establishing the memory 20 farthest from the controller 30A as the reference, it is preferable for the set value of the strobe delay circuit 212 thereof to be established as a relatively small value.

The semiconductor device 1A according to the second embodiment of the present invention including the above such configuration rapidly outputs data, while being relatively low cost, similarly to the semiconductor device 1 according to the first embodiment.

Figure 5:
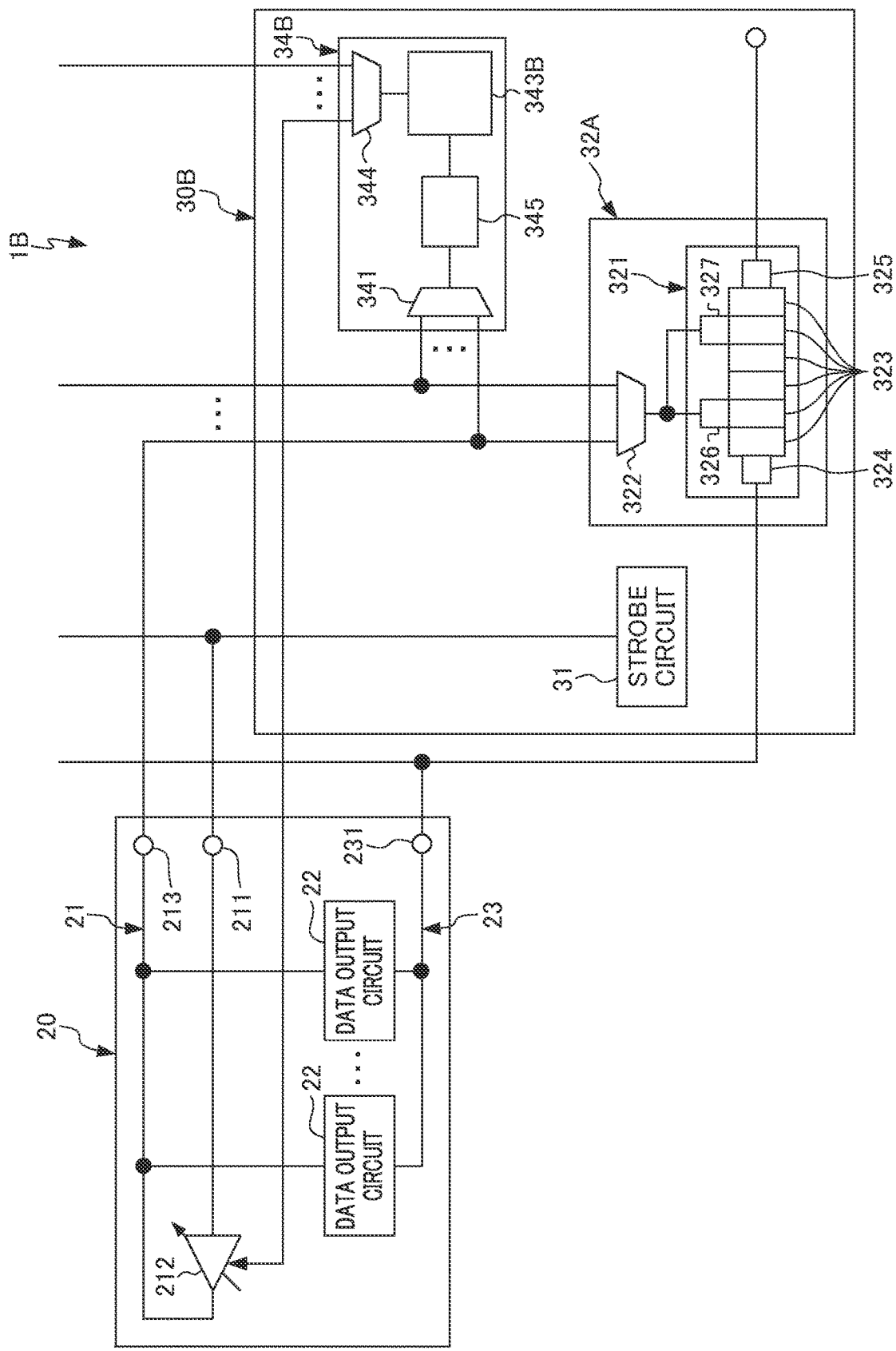
FIG. 5 is a simplified circuit diagram showing a main circuit configuration of a semiconductor device according to a third embodiment of the present invention.

FIG. 5 is a simplified circuit diagram showing the circuit configuration of a semiconductor device 1B according to a third embodiment of the present invention. The semiconductor device 1B according to the present embodiment includes a package substrate 10, a plurality of memory 20, and a single controller 30B.

The controller 30B includes: a strobe circuit 31 which inputs the strobe signal to the strobe input terminal 211; a data buffer circuit 32A which receives data outputted from the data output terminal 231, temporarily stores the received data, and outputs data synchronously with the strobe signal outputted from the strobe output terminal 213; and a delay adjustment circuit 34B which adjusts the delay amount of the strobe delay circuit 212 so as to reduce the difference between the memory 20 of the delay of the strobe signal outputted from the strobe output terminal 213 relative to the strobe signal outputted from the strobe circuit 31.

The delay adjustment circuit 34B measures each of the delay times relative to the strobe signal outputted from the strobe circuit 31 of the strobe signal fed back from each memory 20, and adjusts the set value of the delay amount of the strobe delay circuit 212 of each memory 20, so that the delay times of the respective memory 20 become substantially equal. This adjustment may be performed by repeating adjustment between two memory 20, may be performed by measuring the delay time of feedback of all memory 20, and then determining the set value of the strobe delay circuit 212 of each memory 20, or may adjust the set value of the strobe delay circuit 212 individually so as to make the delay time of each memory 20 approach a set value which is set in advance.

More specifically, the delay adjustment circuit 34B can be established as a configuration including: an input selector 341 which selects a feedback signal from the memory 20 serving as a measurement target; a delay detection timer 345 which measures the delay time of the feedback signal relative to the strobe signal outputted from the strobe circuit 31; a delay amount arithmetic unit 343B; and an output selector 344.

The semiconductor device 1B according to the third embodiment of the present invention having the above such configuration can also rapidly output data, while being relatively low cost.

Figure 6:
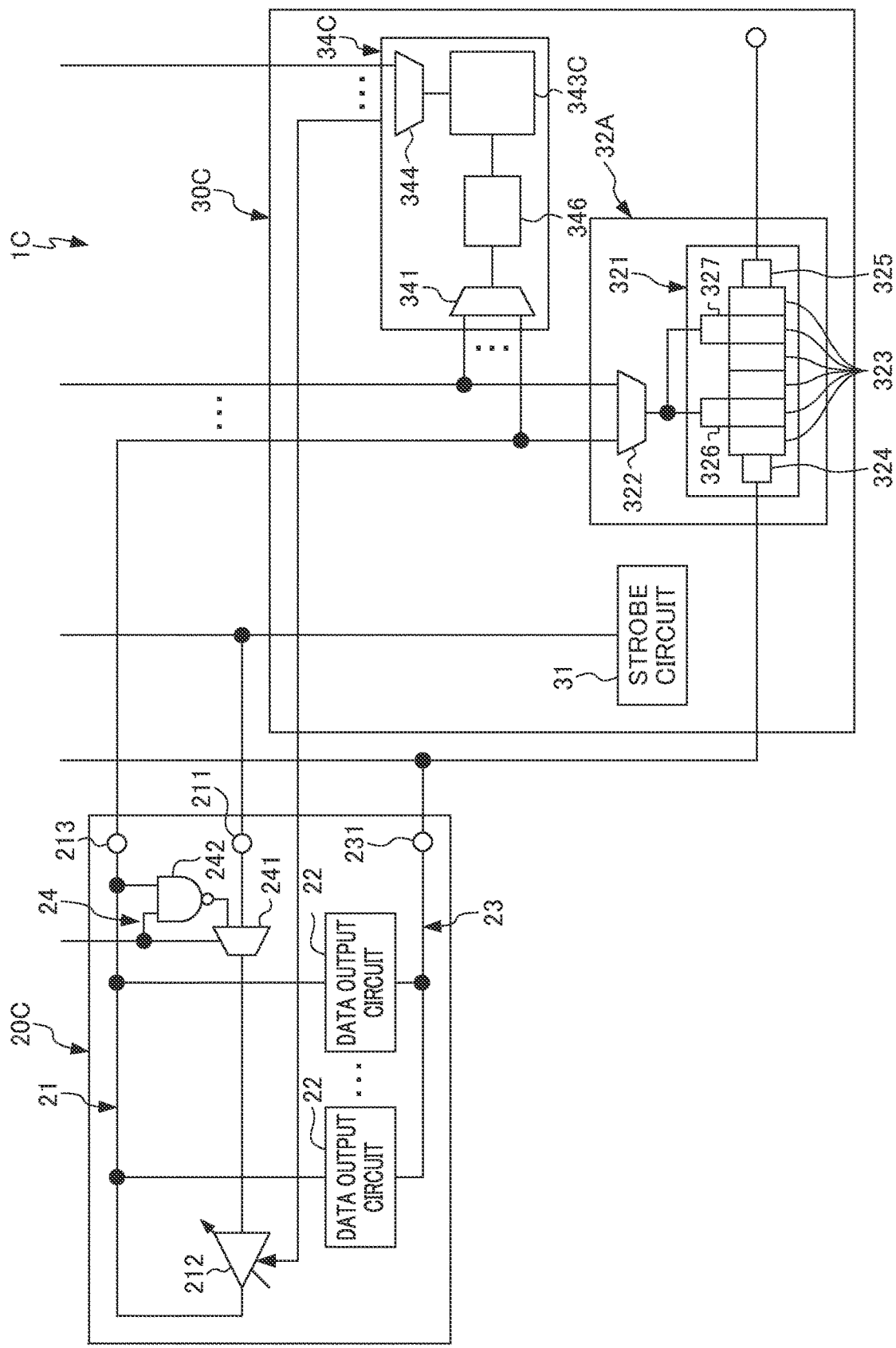
FIG. 6 is a simplified circuit diagram showing a main circuit configuration of a semiconductor device according to a fourth embodiment of the present invention.

FIG. 6 is a simplified circuit diagram showing the circuit configuration of a semiconductor device 1C according to a fourth embodiment of the present invention. The semiconductor device 1C according to the present embodiment includes a package substrate 10, a plurality of memory 20C and a single controller 30C.

The memory 20C includes: a strobe signal transmission path 21 which transmits a strobe signal inputted from the controller 30; a plurality of data output circuits 22 connected to the strobe signal transmission path 21, respectively storing data, and outputting data when the strobe signal is inputted from the strobe signal transmission path 21; a common data output bus 23 which is connected to the plurality of data output circuits 22, and for externally outputting data outputted from each data output circuit 22; and a feedback circuit 24 which connects between the strobe input terminal 211 and strobe output terminal 213 (upstream portion and downstream portion of strobe signal transmission path 21), and configures an oscillatory circuit (ring oscillator) including the strobe signal transmission path 21.

A feedback selector 241 which selects either of the signal inputted to the strobe input terminal 211 or the signal fed back from the feedback circuit 24, and outputs to the upstream side of the strobe signal transmission path 21, is arranged on the upstream part of the strobe signal transmission path 21. The feedback circuit 24 has an NAND (NOT-AND) element 242. A signal outputted from the strobe output terminal 213, and oscillation trigger signal inputted upon starting oscillation are inputted to the NAND element 242. The oscillation trigger signal is inputted as a signal selecting the signal fed back from the feedback circuit 24 also to the feedback selector 241.

The controller 30C includes: the strobe circuit 31 which inputs the strobe signal to the strobe input terminal 211; a data buffer circuit 32A which receives data outputted from the data output terminal 231, temporarily stores the received data, and outputs data synchronously with the strobe signal outputted from the strobe output terminal 213; and a delay adjustment circuit 34C which adjusts the delay amount of the strobe delay circuit based on the cycle of the signal outputted from the strobe output terminal 213.

The delay adjustment circuit 34C observes the oscillation frequency of the oscillation circuit formed from the strobe signal transmission path 21 and feedback circuit 24 as the frequency of the signal outputted from the strobe output terminal 213, and adjusts the delay amount of the strobe delay circuit 212, so that the difference in oscillation frequency between memory 20 decreases. In this way, it is possible to decrease the difference in delay time of each memory 20, by making the oscillation frequency of the oscillation circuit formed from the strobe signal transmission path 21 and feedback circuit 24 of each memory 20 to be substantially equal.

More specifically, the delay adjustment circuit 34C can be established as a configuration including: an input selector 341 which selects a signal outputted from the strobe output terminal 213 of the memory 20 serving as a measurement target; a frequency sensor 346 which measures the frequency of the signal outputted from the strobe output terminal 213 by oscillation of the memory 20 serving as the measurement target; a delay amount arithmetic unit 343C which calculates the set value for the delay amount of the strobe delay circuit 212 which can decrease the difference between memory 20 of the frequency measured by the frequency sensor 346; and an output selector 344 which selects the memory 20 setting the delay amount of the strobe delay circuit 212.

The semiconductor device 1C according to a fourth embodiment of the present invention having the above such configuration can also rapidly output data, while being relatively low cost.

Although embodiments of the present invention have been explained above, the present invention is not to be limited to the aforementioned embodiments, and various changes and modifications thereto are possible. As an example, in the semiconductor device according to the present invention, the buffer circuit is not limited to having a FIFO circuit, and may have any configuration so long as being able to externally output data outputted from the memory 20 stably. In addition, the controllers 30, 30A, 30B and 30C are applicable to both the structure shown in FIG. 1 and the structure shown in FIG. 3. In addition, the control delay circuit 33 is applicable to the controllers 30A, 30B and 30C. In this case, as the input signal of the output pointer 327 of the FIFO circuit 321, it is possible to use the output signal of the control delay circuit 33.

EXPLANATION OF REFERENCE NUMERALS 1, 1A, 1B, 1C semiconductor device
10 package substrate
20, 20C memory
21 strobe signal transmission path
211 strobe input terminal
212 strobe delay circuit
213 strobe output terminal
22 data output circuit
23 data output bus
231 data output terminal
24 feedback circuit
241 feedback selector
242 NAND element
30, 30A, 30B, 30C controller
31 strobe circuit

The invention claimed is:

1. A semiconductor device comprising:
a plurality of memories each including:
a strobe signal transmission path having, in this order, a strobe input terminal to which a strobe signal is inputted, a strobe delay circuit which delays the strobe signal, and a strobe output terminal which outputs the strobe signal delayed by the strobe delay circuit, the strobe signal transmission path sending the strobe signal from the strobe input terminal to the strobe output terminal;
a plurality of data output circuits connected to a downstream side of the strobe delay circuit of the strobe signal transmission path, storing respective data, and outputting the data when the strobe signal delayed by the strobe delay circuit is inputted; and
a data output bus connected to the plurality of data output circuits and having a data output terminal which externally outputs the data; and
a controller including:
a strobe circuit which inputs the strobe signal to the strobe input terminal;
a data buffer circuit which receives the data outputted from the data output terminal, temporarily stores the data received, and outputs the data according to the strobe signal outputted from the strobe output terminal; and
a delay adjustment circuit which adjusts a delay amount of the strobe delay circuit so as to decrease a difference between one and another of the plurality of memories in delay of the strobe signal delayed by the strobe delay circuit and outputted from the strobe output terminal relative to the strobe signal outputted from the strobe circuit.

2. The semiconductor device according to claim 1, wherein the controller further includes a control delay circuit which delays the strobe signal outputted from the strobe circuit, and
wherein the delay adjustment circuit adjusts a delay amount of the strobe delay circuit based on a phase difference between the strobe signal outputted from the control delay circuit and the strobe signal outputted from the strobe output terminal.

3. The semiconductor device according to claim 1, wherein the delay adjustment circuit adjusts a delay amount of the strobe delay circuit, based on a phase difference between the strobe signals outputted from the strobe output terminals of two of the plurality of memories in response to one of the strobe signal outputted from the strobe circuit.

4. The semiconductor device according to claim 1, wherein the delay adjustment circuit measures a time from when the strobe circuit outputs the strobe signal until the strobe signal is outputted from the strobe output terminal.

5. The semiconductor device according to claim 1, wherein each of the plurality of memories further includes a feedback circuit connected between the strobe input terminal and the strobe output terminal, and forming an oscillation circuit together with the strobe signal transmission path, and
wherein the delay adjustment circuit adjusts a delay amount of the strobe delay circuit based on a cycle of the strobe signal outputted from the strobe output terminal.

6. The semiconductor device according to claim 1, wherein the delay adjustment circuit adjusts a delay amount of the strobe delay circuit in a case of an operating condition of the semiconductor device having changed.

7. The semiconductor device according to claim 1, wherein the strobe signal transmission path, the plurality of data output circuits and the data output bus are arranged so that a path length from the strobe input terminal until the data output terminal is constant irrespective of any data output circuit of the plurality of data output circuits passed through.

* * * * *